United States Patent [19]

Freeman

[11] 4,377,807
[45] Mar. 22, 1983

[54] COARSE/FINE DIGITAL PATTERN COMBINER FOR HIGH ACCURACY

[75] Inventor: Elzie H. Freeman, Panama City, Fla.

[73] Assignee: The United States of America as represented by the Secretary of the Navy, Washington, D.C.

[21] Appl. No.: 300,867

[22] Filed: Sep. 10, 1981

[51] Int. Cl.³ ............................................. H03K 13/02
[52] U.S. Cl. ............................ 340/347 P; 340/347 AD
[58] Field of Search ....... 340/347 AD, 347 M, 347 P, 340/347 SY, 347 NT; 364/556

[56] References Cited

U.S. PATENT DOCUMENTS

| | | | |
|---|---|---|---|
| 2,630,552 | 3/1953 | Johnson | 318/28 |
| 2,630,562 | 4/1949 | Johnson | 340/347 |
| 2,779,539 | 4/1954 | Darlington | 235/61 |
| 2,885,613 | 5/1959 | Myracle et al. | 318/28 |
| 3,096,444 | 7/1963 | Seward | 250/220 |
| 3,534,360 | 12/1966 | Hafle | 340/347 |
| 3,603,978 | 7/1969 | Narukiyo | 340/347 P |
| 3,614,774 | 5/1968 | Clements | 340/347 P |
| 3,675,235 | 7/1972 | Wayman | 340/347 P |
| 3,855,585 | 12/1974 | Stout | 340/347 AD |

Primary Examiner—C. D. Miller
Attorney, Agent, or Firm—Robert F. Beers; Harvey A. David

[57] ABSTRACT

A rotary shaft position measurement system using digital position detectors providing coarse and fine binary word readouts having four overlapping bits all of which are having subtractively compared to provide command signals that are used to correct the non-overlapping portion of the coarse word prior to combining with the fine word. The comparator utilizes a binary four bit full adder in combination with coarse word input inversion, and direct and inverted application of the carryout and Σ4 outputs to first and second AND gates to generate coarse word correction commands.

6 Claims, 4 Drawing Figures

| DECIMAL DIFFERENCE (FINE − COARSE) | CARRY-OUT | Σ4 | X | Y | ACTION TO TAKE WITH COARSE UPPER SEVEN BITS |
|---|---|---|---|---|---|
| 0 TO +7 | 1 | 0 | 0 | 0 | LEAVE AS IS |
| −1 TO −8 | 0 | 1 | 0 | 0 | LEAVE AS IS |
| +8 TO +15 | 1 | 1 | 1 | 0 | SUBTRACT ONE COUNT |
| −9 TO −15 | 0 | 0 | 0 | 1 | ADD ONE COUNT |

COARSE/FINE DIGITAL PATTERN COMBINER FOR HIGH ACCURACY

BACKGROUND OF THE INVENTION

This invention relates generally to read-out circuits for rotary shaft or other position encoders using coarse and fine binary digital data generators, and more particularly to an improved read-out circuit, or system employing such circuit, of the type that combines two digital measurements of different resolutions into a single digital measurement.

The measurement and interpretation of angular shaft position, for example, has been accomplished using either plural rotary discs driven in a predetermined ratio and carrying code patterns having coarse and fine angular resolutions or using a single disc with coaxial patterns of different resolutions. The code patterns are detected, coverted to overlapping binary numbers representative of the coarse and fine resolution disc positions, the binary numbers interpreted by logic means to provide a composite binary digital number that can be used in that form or be converted to an analog angular measurement of the shaft position. U.S. Pat. Nos. 2,630,552, 2,779,539, 2,885,613, and 3,534,360 provide examples of such systems with certain variations.

One of the more troublesome and prevalent problems in such systems is found to lie in the manner of justification of, or correction to, the coarse binary readout in order to accommodate differences between the overlapping portions of the binary readouts of the coarse and fine resolution patterns so as to provide a composite number that represents the shaft angular position with the accuracy desired. In at least one known prior art system, the problem has manifested itself in a non-monotonic increase in the output of the system for monotonically increasing input angles with the result that, when the system forms part of a position measuring system, such as connected with operation of a submersible vehicle control surface for example, there has been an undesirable amount of chatter developed at many position angles.

In that system using a stator and rotor disc set and intended to provide angular measurement of shaft position with an accuracy of 0.005 degrees over a full 360 degrees the discs are embedded with a single coarse pattern that covers the entire 360 degrees and 128 fine patterns, each covering 2.8125 degress. Movement of the coarse pattern produces analog voltages that are converted and read out as an eleven bit binary digital number with each successive bit position in the number representing a larger angular increment or bit value. The fine pattern read out is a nine bit binary digital number with each successive bit position in the number also representing a larger angular increment or bit value. These digital numbers overlap in bit values by 4 bits which, ideally, would be identical and a composite binary number accurately representative of the shaft position would consist of the upper seven most significant bits of the coarse pattern number and the nine bits of the fine pattern number.

The comparison logic operates on three of the four overlapping binary bits of the coarse and fine binary numbers to determine the need to add one count to the non-overlapping bits of the coarse pattern number, to subtract one count therefrom, or to leave that number as is. Because the comparison logic is capable of using only three overlapping bits, the determinable difference therebetween is limited to a decimal 7, giving rise to inconsistent corrective actions for a given decimal difference. Moreover, the angular difference between the coarse and fine patterns that can properly be protected against in that system is 2 counts of the 0.352 degree bit or 0.704 degrees.

SUMMARY OF THE INVENTION

With the foregoing in mind, it is a principal object of this invention to provide, in a system of the type wherein two digital measurements of different resolutions are combined, improved comparison logic means for determining corrective actions to take with one of the two digital measurements when they differ.

Another important object is to provide an improved coarse/fine comparator that establishes the difference between predetermined overlapping binary digits of the two measurements, and generates an appropriate correction command.

Still another object is the provision of a digital logic circuit of the foregoing character that makes full use of four overlapping data bits of coarse and fine binary word readouts of a system employing rotary disc means carrying coarse and fine coded patterns.

Other objects and many of the attendant advantages will be readily appreciated as the subject invention becomes better understood by reference to the following detailed description, when considered in conjunction with the accompanying drawings.

DESCRIPTION OF THE PREFERRED EMBODIMENT

Figure 1:
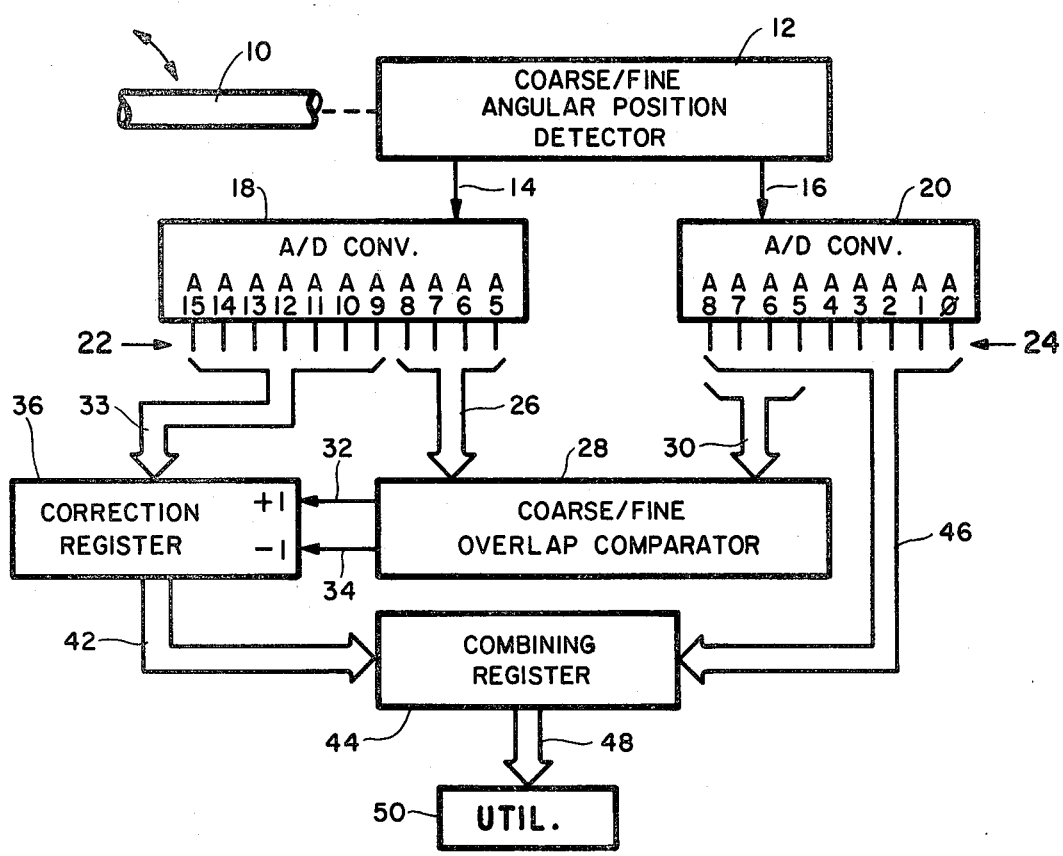
FIG. 1 is a diagrammatic illustration, in block form, of a rotary shaft angle measurement system embodying the invention.

Referring to FIG. 1, a rotary shaft 10, the angular position of which is to be measured, provides input to a coarse/fine angular position detector 12, conveniently of known coded disc and stator type wherein disc means is provided with a coarse resolution pattern and a plurality of fine resolution patterns. In this example, consider a single coarse pattern to cover a full 360° and 128 fine patterns each of 2.8125 degrees of rotation. As the shaft 10 rotates the detector provides analog voltage outputs 14 and 16 representative of coarse and fine pattern movements, respectively, relative to the stator. The analog outputs 14 and 16 are applied to analog to digital converters 18 and 20, respectively.

Figure 2:
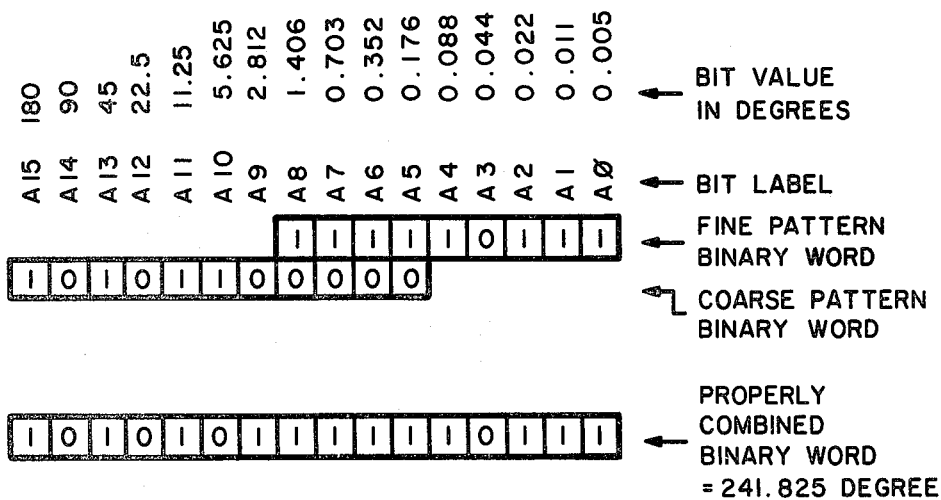
FIG. 2 is a tabular illustration of overlapping coarse and fine binary word readouts.

The output 22 of the converter 18 comprises, in this example, an eleven bit binary number, representative of coarse pattern position, while the output 24 of the converter 20 comprises a nine bit binary number representative of angular position within one of the 128 fine patterns. The lower or least significant four bits of the coarse pattern binary number output 22 of the converter 18 overlap the upper or most significant four bits of the fine pattern binary number output 24 of the converter 20. This relationship is shown in FIG. 2 where the overlapping bit positions are labeled A5, A6, A7, and A8.

Reverting to FIG. 1, the overlapping lower four bits of the coarse pattern binary number are applied, as indicated at 26, as one input to a coarse/fine overlap comparator 28. The overlapping upper four bits of the fine pattern binary number are applied, as shown at 30, as a second input to the overlap comparator 28 which will be later discussed in greater detail with reference to FIG. 3. Suffice it to say for now, that the comparator uses differences between the coarse and fine four bit overlap to determine whether the upper seven bit portion of the coarse binary word will have a count added, substracted, or be left the same, and provides an output 32 representative of the first of those three conditions, an output 34 representative of the second of those conditions, or no output for the third. The outputs 32, 34 are applied as control inputs to a correction register 36. The upper seven bits of the coarse pattern binary number output 22 of the converter 18 are applied, as shown at 38 to the register 36.

The output 42 of the register 36 is the corrected upper seven bit portion of the eleven bit coarse pattern number, and is applied as one input of a binary number combining register 44. A second input to the combining register 44 is the nine bit binary number of the fine pattern as shown by line 46. The output of the combining register is a sixteen bit binary number consisting of the corrected upper seven bits of the coarse pattern number and all nine bits of the fine pattern number. The bit positions are indicated as A0–A16 in FIG. 2. The binary output 48 can be utilized directly by digital utilization means 50 to provide a function such as position control feedback or the like that accurately corresponds to the angular position of shaft 10.

Figures 3, 4:
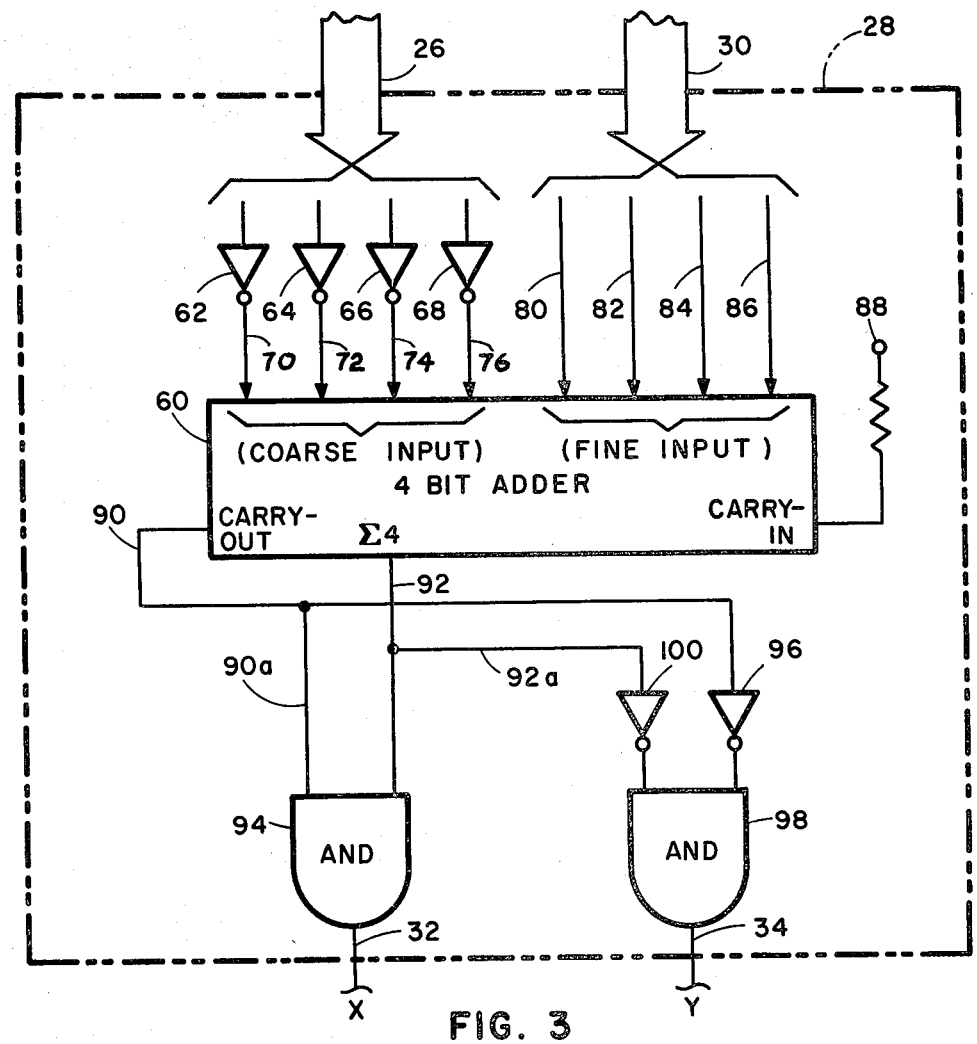
FIG. 3 is a diagrammatic illustration, in block form, showing the coarse/fine comparator element of FIG. 1 in greater detail.
FIG. 4 is a tabular illustration, or truth table, showing the relationships occurring during functioning of the coarse/fine comparator of FIG. 3.

Referring additionally now to FIG. 3, the coarse/fine overlap comparator 28 may conveniently comprise a four bit binary full adder 60, for example of a circuit type SN 5483.

As indicated earlier, the input 26 comprises the lower four, or A5, A6, A7, and A8 position bits of the coarse pattern number, while the input 30 comprises the overlapping upper four, or A5, A6, A7, and A8 position bits of the coarse pattern number, while the input 30 comprises the overlapping upper four, or A5, A6, A7, and A8 position bits of the fine pattern number. The four bits of input 26 are applied in parallel to four inverters 62, 64, 66, and 68, respectively, the outputs 70, 72, 74, and 76 of which are connected to the four A input terminals of the adder 60. The B input terminals of the adder 60 are connected to receive the A5, A6, A7, and A8 bits of input 30 directly, without inversion, as shown at 80, 82, 84, and 86. A supply voltage $V_{cc}$ is provided at terminal 88, and the utilized outputs comprise a carry out signal via line 90 and a serial summation (Σ4) signal via line 92. The former is applied via line 90a as one of two inputs to a first AND gate 94 and via an inverter 96 as one of two inputs to a second AND gate 98. The Σ4 output, line 92, is applied as a second input to the first AND gate 94 and via line 92a and an inverter 100 as a second input to the second AND gate 98. The outputs of the AND gates 94 and 98 constitute the add or substrate one count command outputs 32, 34 of the comparator 28 to the correction register.

The comparator 28, which is implemented to subtract the four overlapping bits of coarse from the corresponding bits of the fine word, provides consistent corrective actions for given differences between the coarse and fine pattern readouts and provides a constant band of protection around the fine word. The table of FIG. 4 shows the results of the subtraction process in the comparator and the corresponding commands for actions to be taken. An example is that of FIG. 2 wherein the overlapping bits of the fine readout are 1111 (15) and of the coarse are 0000 (0). The difference is (15−0) or +15 which means subtract 1 count from the upper seven bits of the coarse word. The foregoing subtraction process is done as a 2's complement add, as follows:

$$\begin{array}{r} 1\ 1\ 1\ 1 \leftarrow \text{fine} \\ 1\ 1\ 1\ 1 \leftarrow \text{coarse inverted} \\ \underline{\phantom{1\ 1\ 1\ }1} \leftarrow \text{carry in} \\ \text{carryout } \underline{\uparrow\uparrow}\ \ 1\ 1\ 1 \\ \Sigma 4 \end{array}$$

This example falls in the third line of the table of FIG. 4, where the difference falls in the +8 to +15 range, the carry out is a 1, and the Σ4 is a 1. The concidence of true inputs to AND gate 94 provides a true X output 32. Because the carry out and Σ4 signals are inverted by inverters 96 and 100, the AND gate Y output 34 is 0. As can be seen from the table of FIG. 4, this produces an action in the correction register 36 of subtract one count from the upper seven bits of the coarse word. FIG. 2 shows the properly combined word output 48 of the combining register 44. It will be noted that the protection is a minimum of seven counts of the A5 (0.176 degree) bit of the coarse pattern, or 1.23 degress. If the coarse count lags by more than +7 from the fine count, it will be interpreted as though the coarse count actually leads the fine pattern. Therefore, where the true patterns differ by more than 1.23 degrees, inappropriate corrections would be made to the coarse pattern count.

Obviously, other embodiments and modifications of the subject invention will readily come to the mind of one skilled in the art having the benefit of the trachings presented in the foregoing description and the drawing. It is, therefore, to be understood that this invention is not to be limited thereto and that said modifications and embodiments are intended to be included within the scope of the appended claims.

What is claimed is:

1. A measurement system comprising in combination:
   first means for generating a first binary number of more than four bits representative of a coarse measurement of a predetermined parameter;
   second means, coupled to said first means, for generating a second binary number of four or more bits representative of a fine measurement of a portion of said predetermined parameter;
   coarse/fine comparator means, responsive to the lower four bits of said first binary number and to the upper four bits of said second binary number, for generating first, second, and third command signal conditions;
   means, responsive to said command signal conditions, for respectively adding one count to, subtracting one count from, or leaving unchanged the upper bit portion of said first binary word to provide a corrected or unchanged first binary word, and;

means for combining said corrected or unchanged first binary word with said second binary word to provide a combined binary word representative of said predetermined parameter;

said coarse/fine comparator means comprising a four bit binary full adder having four first bit inputs, four second bit inputs, a carry-out output and a $\Sigma 4$ output, first inverter means for inserting inputs to said four first inputs, a first AND gate having first and second input connections, a second AND gate having first and second input connections, second inverter means for inverting inputs to said first and second input connections of said second AND gate, said carry out output being connected to one of said input connections to said first AND gate and by said second inverter means to one of said first AND gate and by said second inverter means to one of said inputs connections to said second AND gate, and said $\Sigma 4$ output being connected to the other of said input connections to said first AND gate and by said second inverter means to the other of said input connections of said second AND gate, whereby said first AND gate provides a true output only when said carry out and said $\Sigma 4$ outputs are both true, and said second AND gate provides a true output only when said carry out and said $\Sigma 4$ outputs are both not true, said first output signal condition existing when only one of said AND gates has a true output, said second output signal condition existing when only the other of said AND gates has a true output, and said third output signal condition existing when neither of said AND gates has a true output.

2. A coarse/fine comparator for use in an angular displacement readout system of the type comprising first and second discs encoded with repeating coarse and fine binary patterns and means for converting the positions of said discs to first and second binary words, each having a plurality of digits, N of which overlap, said comparator comprising:

an N bit adder;

N first inverter means connected to invert and apply the N overlapping bits of said first binary word as a first input to said adder;

means connected to directly apply the N overlapping bits of said second binary word as a second input to said adder, whereby said adder effects a subtraction process of said overlapping bits of said second word from said overlapping bits of said first word by a 2's compliment add, so as to provide a carry out bit as a first binary level signal and $\Sigma N$ as a second binary level signal;

first AND means, responsive to coincidence of a predetermined condition of both of said first and second binary level signals to provide a first binary level comparator output;

second inverter means responsive to said first and second binary level signals to provide inverted first and second binary level signals; and second AND means, responsive to coincidence of a predetermined condition of both of said inverted first and second binary level signals to provide a second binary level comparator output.

3. A rotary shaft position measuring system of the type including rotation detecting means for generating a plural bit coarse count binary word and a plural bit fine count binary word, coarse/fine count comparator means, responsive to a predetermined number of overlapping bits of the coarse and fine count words, for providing command signals for correcting the non-overlapping portion of the coarse count word prior to combining with the fine count word to provide a combined binary word representing shaft position, said system being characterized by the improvement wherein said comparator means comprises:

a plurality of first inverter means, corresponding in number to said predetermined number, for inverting said overlapping bits of said coarse count binary word;

a plural bit binary full adder means for subtracting said overlapping bits of said coarse count binary word from said overlapping bits of said fine count binary word to provide a $\Sigma N$ output, where N is said predetermined number, and a carry out output;

first AND gate means, responsive to said $\Sigma N$ and said carry out outputs, for providing as one of said command signals a first true output only when both of said $\Sigma N$ and said carry out outputs are true;

second inverter means for inverting said $\Sigma N$ and said carry out outputs; and second AND gate means, responsive to outputs of said second inverter means, for providing as another of said command signals a true output only when both of said $\Sigma N$ and carry out outputs are not true.

4. A system as defined in claim 3, and wherein:
said coarse count binary word comprises eleven bits, said fine count binary word comprises nine bits, and N equals four.

5. A system as defined in claim 3, and further comprising:
correction means, responsive to said command signals and to said coarse count binary word to add one count to, subtract one count from, or do nothing to the non-overlapping portion of said coarse count binary word prior to said combining thereof with said fine count binary word.

6. A system as defined in claim 4, and further comprising:
correction means, responsive to said command signals and to said coarse count binary word to add one count to, subtract one count from, or do nothing to the non-overlapping portion of said coarse count binary word prior to said combining thereof with said fine count binary word.

* * * * *